(12) United States Patent
Fink

(10) Patent No.: US 6,963,043 B2
(45) Date of Patent: Nov. 8, 2005

(54) ASYMMETRICAL FOCUS RING

(75) Inventor: Steven T. Fink, Mesa, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/647,469

(22) Filed: Aug. 26, 2003

(65) Prior Publication Data

US 2004/0040940 A1 Mar. 4, 2004

Related U.S. Application Data

(60) Provisional application No. 60/406,345, filed on Aug. 28, 2002.

(51) Int. Cl.[7] .............................................. B23K 10/00
(52) U.S. Cl. ............................ 219/121.43; 219/121.48; 156/345.42; 118/723 R
(58) Field of Search ........................ 219/121.4, 121.43, 219/121.48, 121.54, 123, 345.42, 345.46, 345.49; 118/723 R, 723 MW, 723 I

(56) References Cited

U.S. PATENT DOCUMENTS

| | | | |
|---|---|---|---|
| 4,209,357 A | | 6/1980 | Gorin et al. |
| 4,352,974 A | | 10/1982 | Mizutani et al. |
| 4,367,114 A | | 1/1983 | Steinberg et al. |
| 5,411,568 A | | 5/1995 | Moore |
| 5,529,657 A | * | 6/1996 | Ishii ...................... 156/345.26 |
| 5,856,240 A | | 1/1999 | Sinha et al. |
| 2003/0000648 A1 | * | 1/2003 | Park et al. ............. 156/345.51 |
| 2003/0084849 A1 | * | 5/2003 | Shim .......................... 118/715 |
| 2003/0201069 A1 | * | 10/2003 | Johnson ................. 156/345.43 |
| 2003/0227258 A1 | | 12/2003 | Strang et al. |
| 2004/0074605 A1 | * | 4/2004 | Nezu et al. ............ 156/345.47 |

* cited by examiner

*Primary Examiner*—Mark Paschall
(74) *Attorney, Agent, or Firm*—Oblon, Spivak, McClelland, Maier & Neustadt, P.C.

(57) ABSTRACT

An asymmetrical focus ring varies the flow-field, which aids in normalizing pressure gradients across the wafer being processed, thereby improving the process. Embodiments of the present invention utilize a focus ring that either (1) contains a pattern of through holes that enhances pumping, or (2) does not contain any such pattern.

22 Claims, 8 Drawing Sheets

ASYMMETRICAL FOCUS RING

CROSS REFERENCE TO RELATED APPLICATIONS

This application is related to and claims priority to U.S. Provisional Application Ser. No. 60/406,345, filed Aug. 28, 2002. The entire contents of this prior application is incorporated herein by reference.

BACKGROUND OF THE INVENTION

1. Field of the Invention

The present invention is directed to a plasma processing apparatus and a method for using the apparatus to process substrates (e.g., semiconductor wafers or liquid crystal display panels), and in particular to the manufacture and use of an asymmetrical focus ring.

2. Discussion of the Background

As is known in the art, a fundamental step in the manufacture of semiconductor devices, such as integrated circuits (ICs), is the process of forming electrical interconnections. The formation of electrical circuits, such as semiconductor transistors, involves a series of steps starting with the formation of a blank silicon wafer. The blank silicon wafer is then processed using successive steps of depositing and etching away various materials to form the proper interconnections and therefore the electrical circuits.

One method of depositing and etching metal layers to and from a silicon wafer includes the use of a plasma reactor system. In semiconductor manufacturing, plasma reactor systems are used to remove material from or deposit material to a work-piece (e.g., semiconductor wafer) in the process of making integrated circuit (IC) devices. A key factor in obtaining the highest yield and overall quality of ICs is the uniformity of the etching and deposition processes.

In a narrow gap, high aspect ratio capacitively coupled plasma reactor, a multipurpose chuck assembly design is often employed that attempts to allow the chuck assembly (i.e. wafer work piece holder) to serve additional purposes other than supporting the wafer. The complexity of the mechanical design of the chuck assembly is such that a non-optimal vacuum system design is required. A vacuum pumping system is used to evacuate the reactor processing region to the low pressures necessary to create a clean environment, to which a specific gas chemistry is introduced, which provides an environment for the generation of plasma. Consequently, due to the complexity of the mechanical design of the chuck assembly, the symmetry of the vacuum system (relative to the wafer) is sacrificed such that the vacuum pump is usually positioned to access the reactor vacuum chamber from the side rather than from the chamber bottom or top.

This type of multi-purpose chuck assembly can become a very cumbersome component of the reactor. In a multi-purpose chuck assembly design, in addition to supporting the wafer, the chuck assembly is typically configured to provide vertical translation in order to reduce the electrode-to-wafer spacing. This spacing control is necessary in order to produce a narrow gap for process conditions and to enlarge the gap for wafer exchange. In addition to the aforementioned capabilities, the chuck typically sustains a radio frequency (RF) energy bias. Moreover, the chuck assembly design further includes components for chuck block cooling, electrostatic clamping, and backside gas flow to improve thermal conduction (between the wafer and the chuck). Consequently, the vacuum design is often a secondary consideration to other various mechanical and electrical component designs.

A reactor chamber that is equipped with a side mount vacuum port is considered an asymmetrical design in a nominally cylindrical system. An inherent drawback associated with an asymmetric design is that it often times produces an asymmetric process. One such asymmetry stemming from an asymmetric vacuum design is the observation of pressure field non-uniformity above the wafer when the chamber is evacuated from the side. That is, a pressure gradient with about 10–20% variation can occur across the wafer being processed. In general, for moderate to high pressures (e.g. P>20 mTorr), a region of low pressure is observed at an azimuthal location adjacent the pump entrance or pumping duct entrance (the pumping duct interfaces the inlet of the pump, e.g. turbo-molecular pump, with the vacuum chamber). In known capacitively-coupled plasma reactors, attempts to solve the problem of an asymmetric chamber flow field introduced by pumping from the side have included the insertion of an orifice plate adjacent to the chuck.

A processing chamber generally includes a single evacuated volume wherein a portion of that volume is proximate the wafer and is hereinafter referred to as the processing region. When an orifice plate is employed, the chamber volume is separated into two regions by the orifice plate. The first region is predominantly occupied by the wafer processing region and the second region, referred to as the pumping volume, is accessed by the vacuum pump. This solution tends to improve the flow-field uniformity in the upper chamber volume by providing sufficient flow resistance through the orifice plate. However, this improvement is achieved at the expense of flow conductance or pumping speed at the processing region. In addition to placing the orifice plate adjacent the chuck assembly, other known designs included locating the orifice plate adjacent other surfaces, e.g. any surface interfacing the processing chamber volume that allows the exhaust of chamber gases.

There are several inherent problems with the known methods that use an orifice plate to control pressure uniformity in a chamber. For example, known orifice plates typically distribute the small openings equally in the azimuthal direction about the orifice plate in the hope that the resultant flow conductance will be azimuthally symmetric through the plate. However, in order to achieve flow-field uniformity, it is necessary to restrict the flow through the orifice plate to the extent that the pressure difference across the orifice is significantly greater than any pressure gradient in the processing or pumping regions. This requires making the holes in the orifice plate small and, hence, paying a penalty in chamber pumping speed at the wafer. This penalty in pumping speed directly results in an adverse effect on throughput.

In addition to the problem of pressure field non-uniformity described above, an additional problem associated with plasma processing systems is the transport of plasma to the pumping duct and pump inlet. In general, the aforementioned orifice plate or a separate pumping duct screen is utilized to attenuate the plasma density prior to reaching the pump inlet. For example, in known systems a pump screen (with generally less than 50% solidity) is placed in the cross-section of the pumping duct. Unfortunately the pumping screen attenuates the plasma and also reduces the pumping speed delivered to the processing region by at least a factor of two. This approach results in at least 50% of the frontal area of the pumping duct cross-section being utilized for recombination surfaces. In conventional designs, there is a one-to-one relationship between the increase in recombination surface area and the decrease in the frontal (flow-through) area.

SUMMARY OF THE INVENTION

According to one aspect of the present invention, an asymmetrical focus ring varies the flow-field, which aids in normalizing pressure gradients across the wafer being processed, thereby improving the process. Embodiments of the present invention utilize a focus ring that either (1) contains a pattern of through holes that enhances pumping, or (2) does not contain any such pattern.

According to a second aspect, the position of the focus ring of the present invention may be adjusted by rotation on the centerline of the chuck assembly. This rotation allows further adjustment of pressure gradients in the chamber.

The focus rings of the present invention optionally may be utilized with an orifice plate or pumping plenum as an added method to adjust pressure gradients in the chamber. This pumping plenum also may rotate with the focus ring as a single unit.

A focus ring of the present invention may further utilize varying cross-sectional areas to restrict pumping flow in the chamber in varying amounts to reduce pressure gradients in the chamber.

By utilizing asymmetrical or varying geometries, the present invention, even when utilized without a pumping plenum, allows greater pumping speeds in the chamber than designs with a pumping plenum. The present invention also modifies the pressure gradient to a higher degree than designs where asymmetrical or varying cross sectional area focus rings are not used. This invention adds tailoring features to adjust vacuum pumping characteristics.

BRIEF DESCRIPTION OF THE DRAWINGS

These and other advantages of the invention will become more apparent and more readily appreciated from the following detailed description of the exemplary embodiments of the invention taken in conjunction with the accompanying drawings, where.

DETAILED DESCRIPTION OF THE PREFERRED EMBODIMENTS

Figure 1:
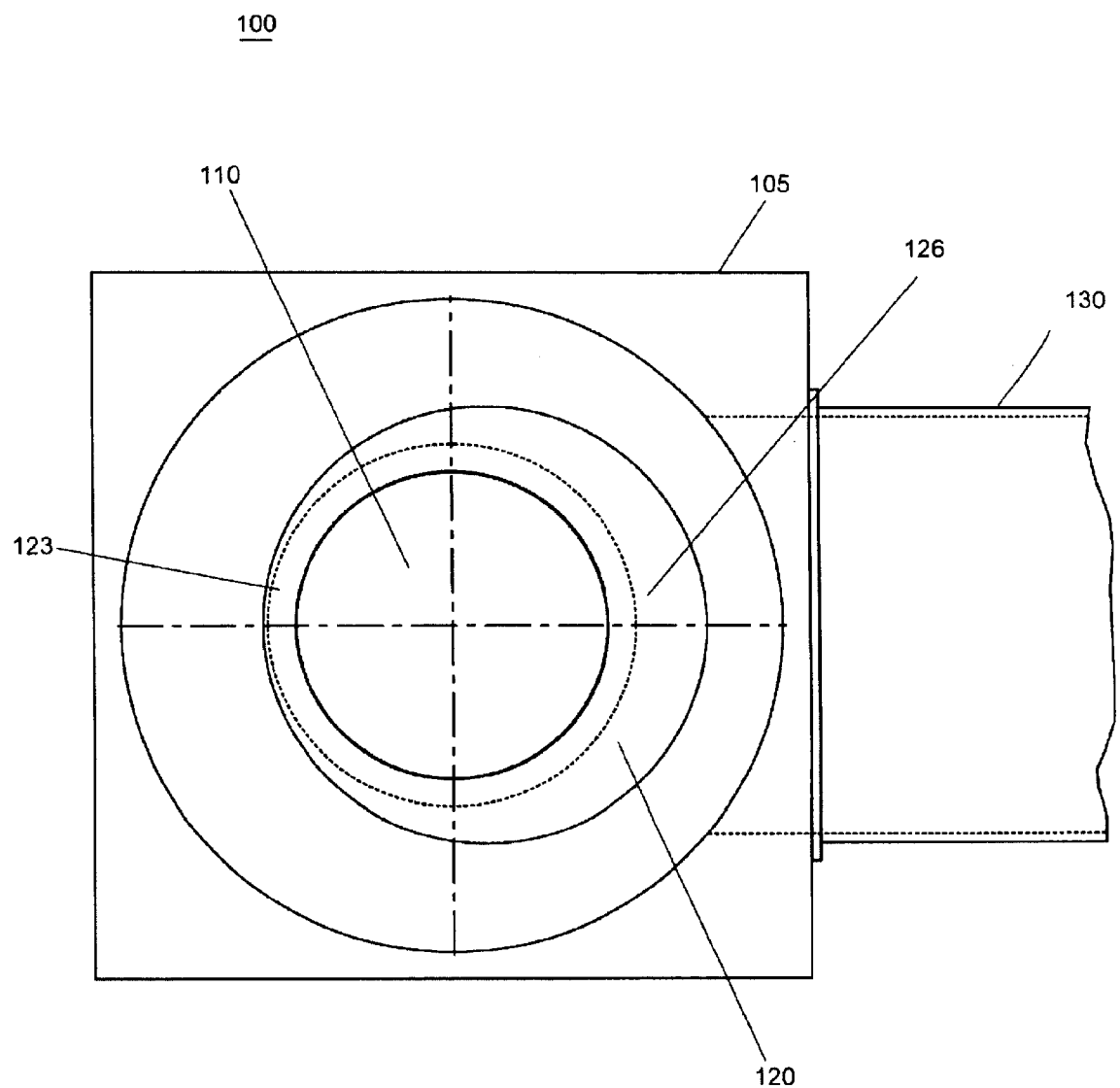
FIG. 1 is a plan view of a portion of a plasma processing system (without a pumping plenum) using an asymmetric focus ring according to the present invention.

According to one aspect of the present invention, as shown in FIG. 1, a plasma processing system 100 is provided that includes a process chamber 105. Housed within the plasma process chamber 105 is a chuck assembly 110 for supporting a substrate during processing and a focus ring 120 which encircles an upper portion of the chuck assembly 110. As illustrated, the focus ring 120 is asymmetric and includes a minor side 123 and a major side 126. The major side 126 is provided closer to the pumping duct 130 that evacuates the plasma chamber 105. For example, the minor side 123 can range from 0.5 to 2.5 cm in width, and the major side 126 can range from 2.5 to 10 cm in width.

The asymmetrical focus ring may be made from any number of materials (e.g., quartz, silicon, silicon carbide, carbon, ceramic or some dielectric or partially metal structure). In one embodiment of the present invention, the ring is made from a uniform surface roughness. In an alternate embodiment, the ring is made to have a varying surface roughness.

Without an asymmetrical focus ring, a region of low pressure is located adjacent to the pumping duct entrance. Accordingly, the asymmetrical focus ring 120 is constructed and placed in such a manner as to restrict flow in the area near the major side (i.e., in the area of the least pressure) of the process chamber 105. Proceeding around the focus ring 105 in either direction away from the major side 126, the restriction is lessened to a point where no restriction occurs near the minor side 123 (i.e., where pressure in the process chamber 105 is the highest). Furthermore the focus ring 120 is rotatable about a central axis of the chuck assembly 110.

Figure 2:
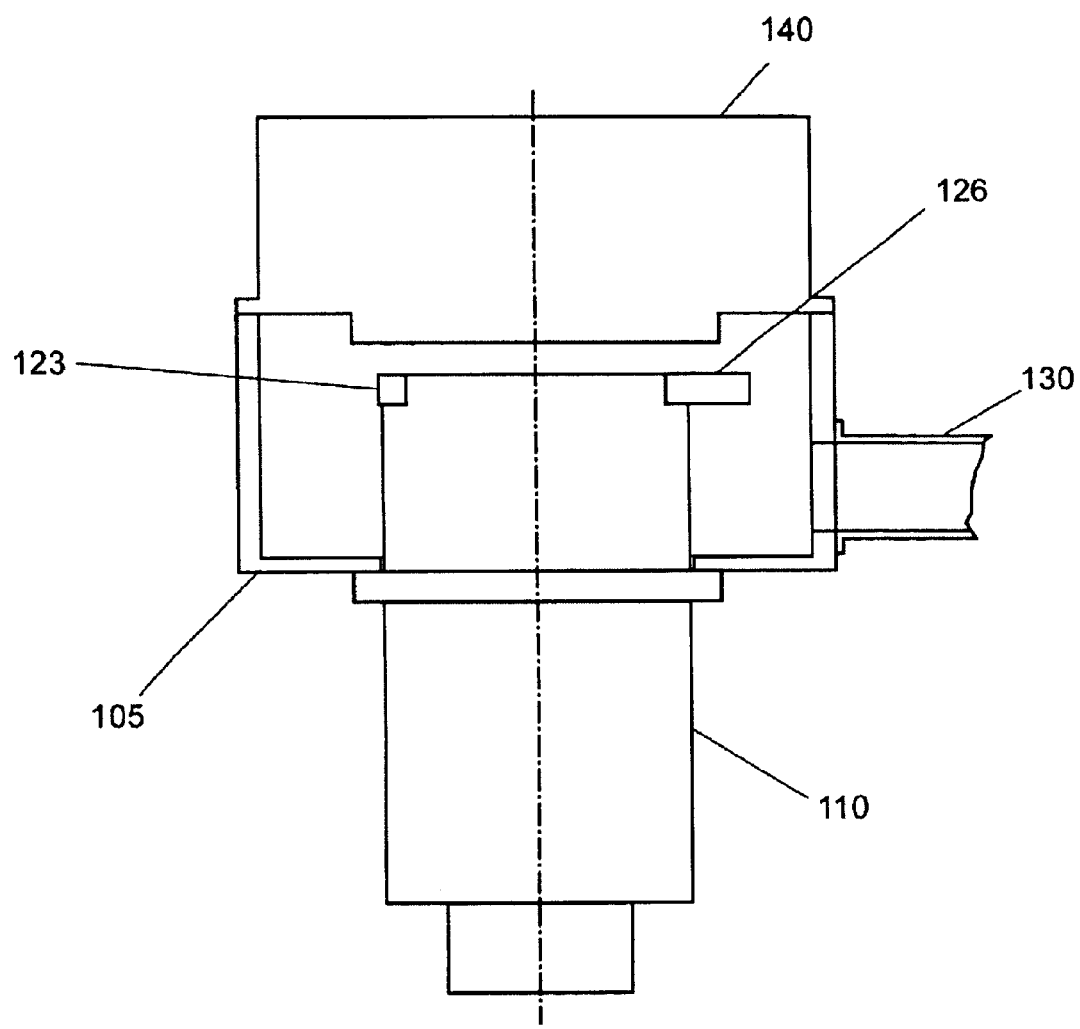
FIG. 2 is a cross-sectional side view of the plasma processing system of FIG. 1.

As shown in FIG. 2, the focus ring 120 is held atop the chuck assembly 110 and opposite an upper electrode assembly 140. The upper electrode assembly 140 may further include an impedance matching network (e.g., a fast match assembly). The chuck assembly 110 may be brought closer to the upper electrode 140 during processing and moved further away when the substrate is being exchanged. The movement may be controlled in conjunction with an automatic or robotic substrate transfer system (not shown).

Figure 3:
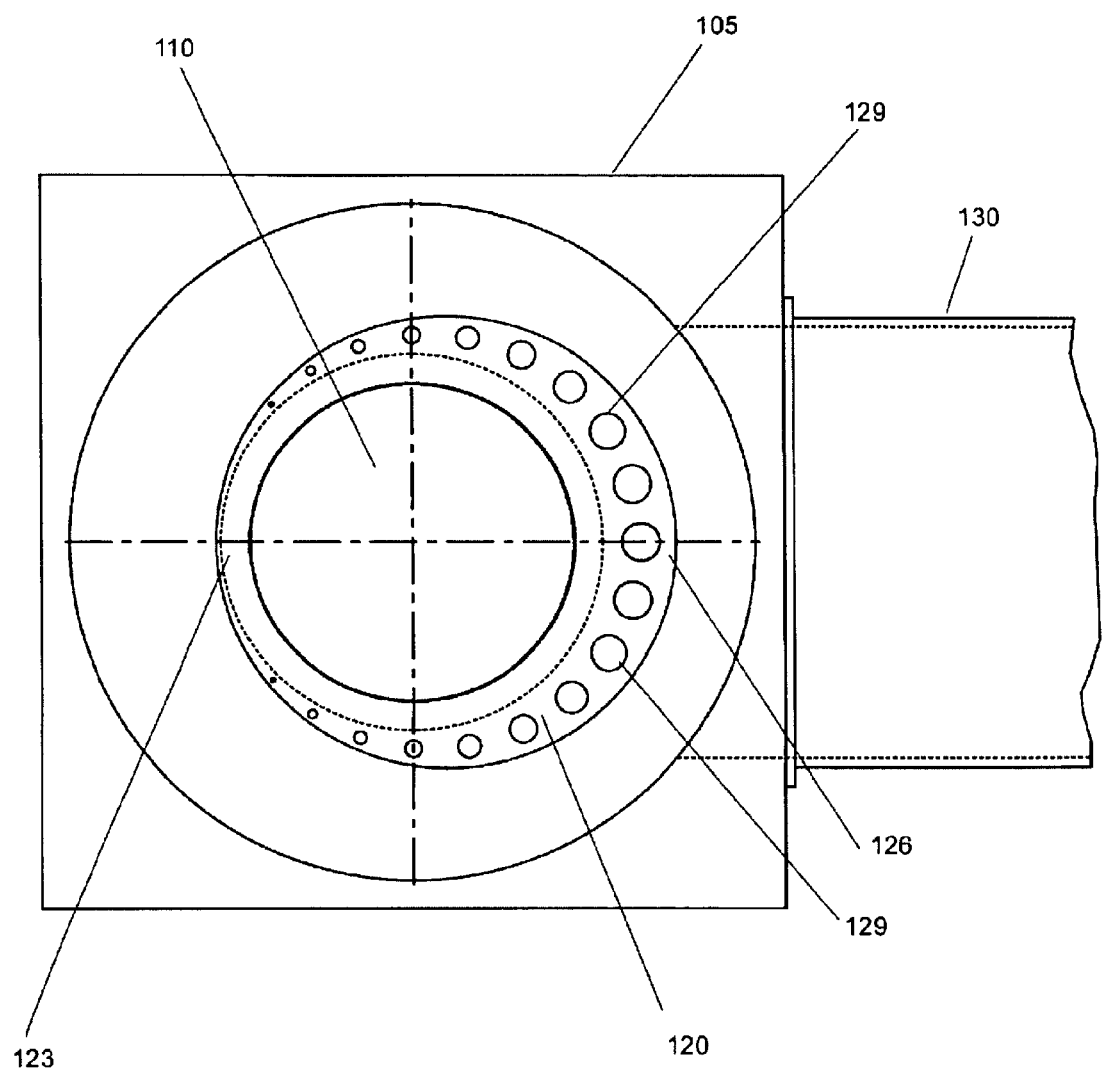
FIG. 3 is a plan view of a portion of a plasma processing system (without a pumping baffle) using an asymmetric focus ring containing holes according to the present invention.
Figure 4:
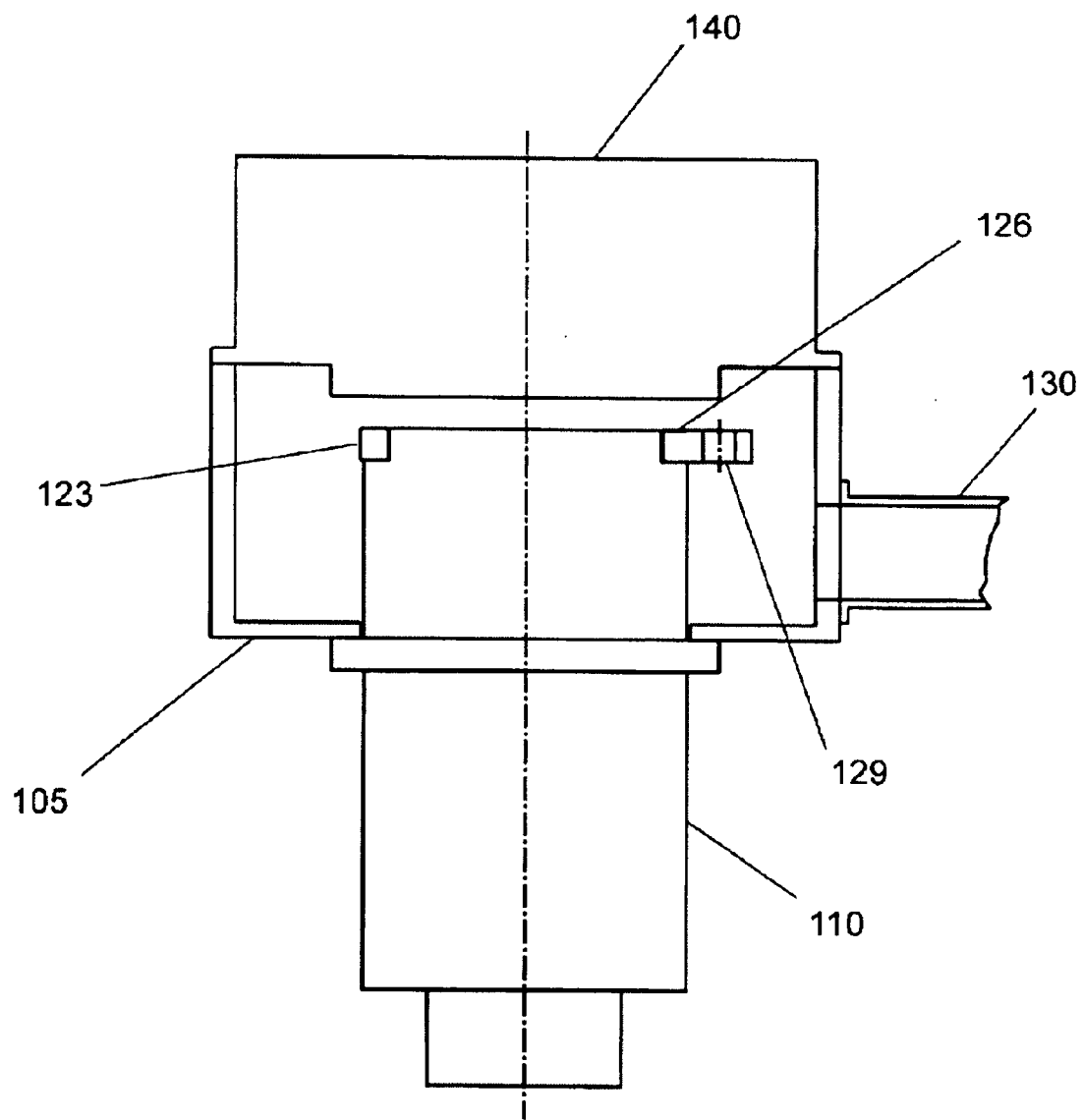
FIG. 4 is a cross-sectional side view of the plasma processing system of FIG. 3.

According to an exemplary embodiment of the present invention shown in FIGS. 3 and 4, an asymmetrical focus ring 120 is provided with a pattern of holes 129 to enhance pumping. The configuration of holes 129 may be other than as shown in the figures, but generally the configuration is selected to reduce pressure in the chamber 105 at the minor side 123 as compared to at the major side 126.

Figure 5:
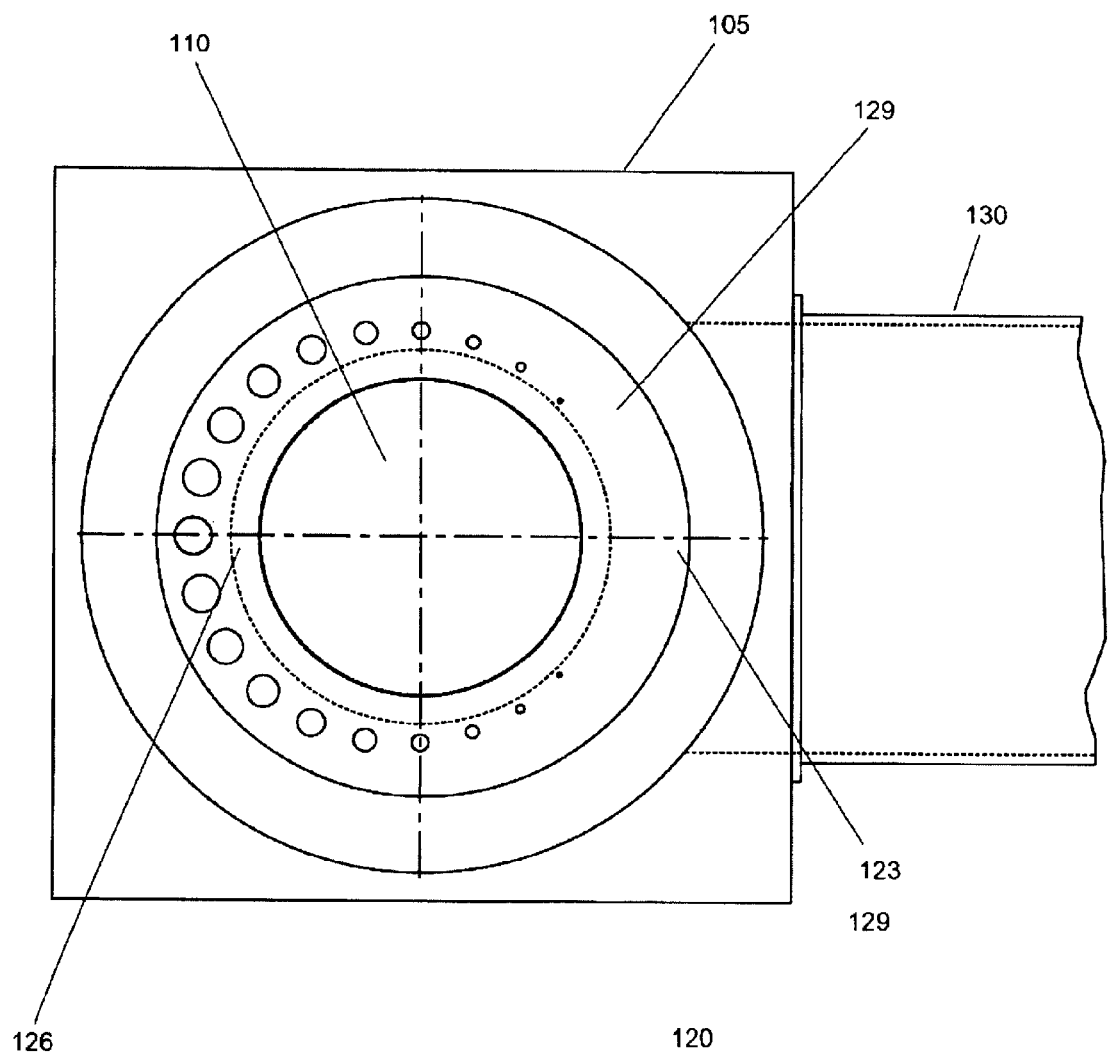
FIG. 5 is a plan view of a portion of a plasma processing system (without a pumping plenum) using a symmetric focus ring with asymmetrical holes according to the present invention.

Advantageously, the holes 129 in the focus ring 120 tend to confine a plasma to a processing volume versus significantly reducing pumping volume. This provides a good balance between pumping speed and uniformity which is lacking in known systems. Alternately, as shown in FIG. 5, focus ring 120 can comprise a minor side 123 substantially equivalent in width to the major side 126, wherein the asymmetry in design is introduced by the size of the holes distributed about the focus ring 120. Alternately, the number density of holes can be varied about the focus ring 120.

Figure 6:
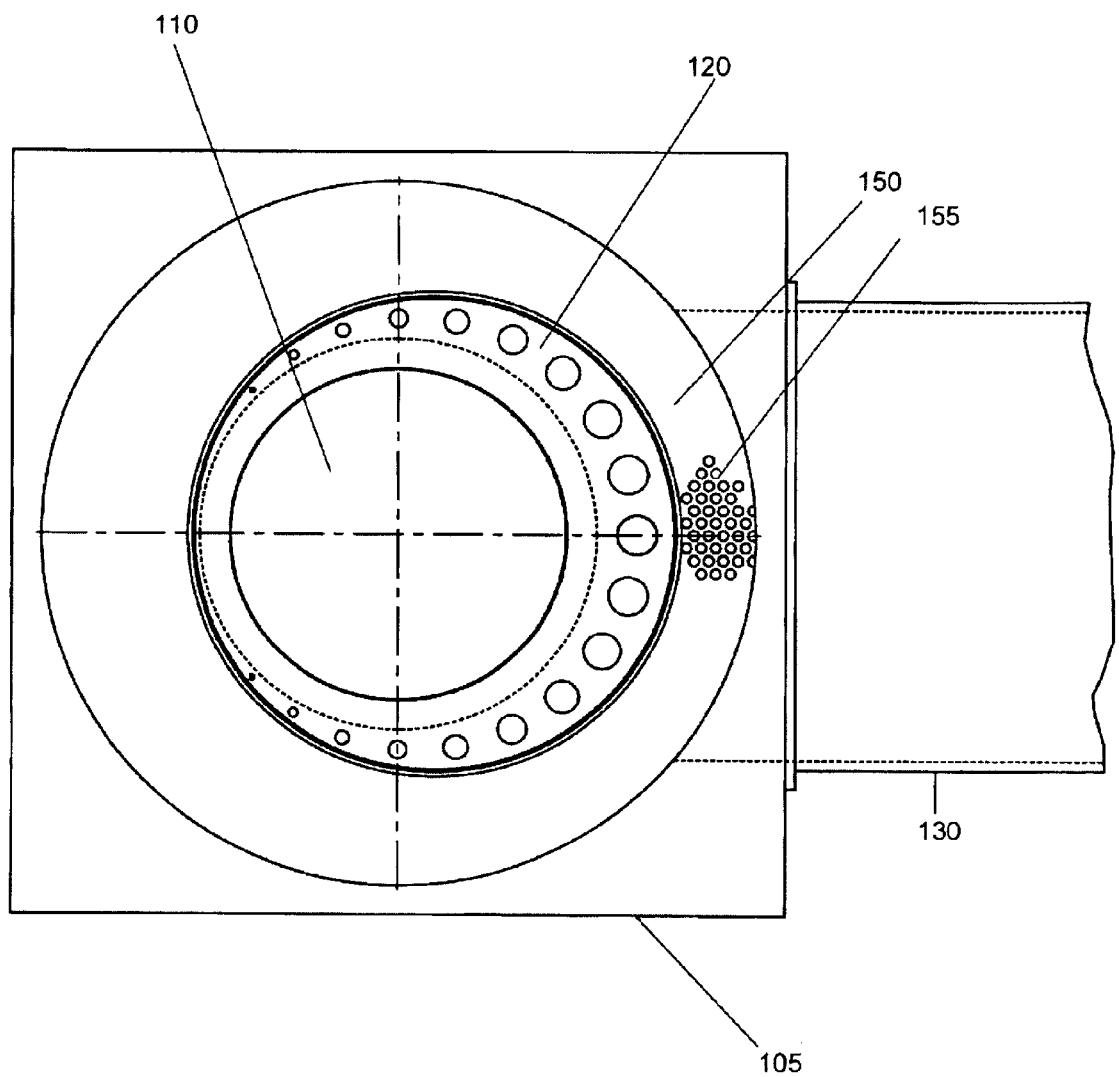
FIG. 6 is a plan view of a portion of a plasma processing system (with a pumping baffle) using an asymmetric focus ring containing holes according to the present invention.
Figure 7:
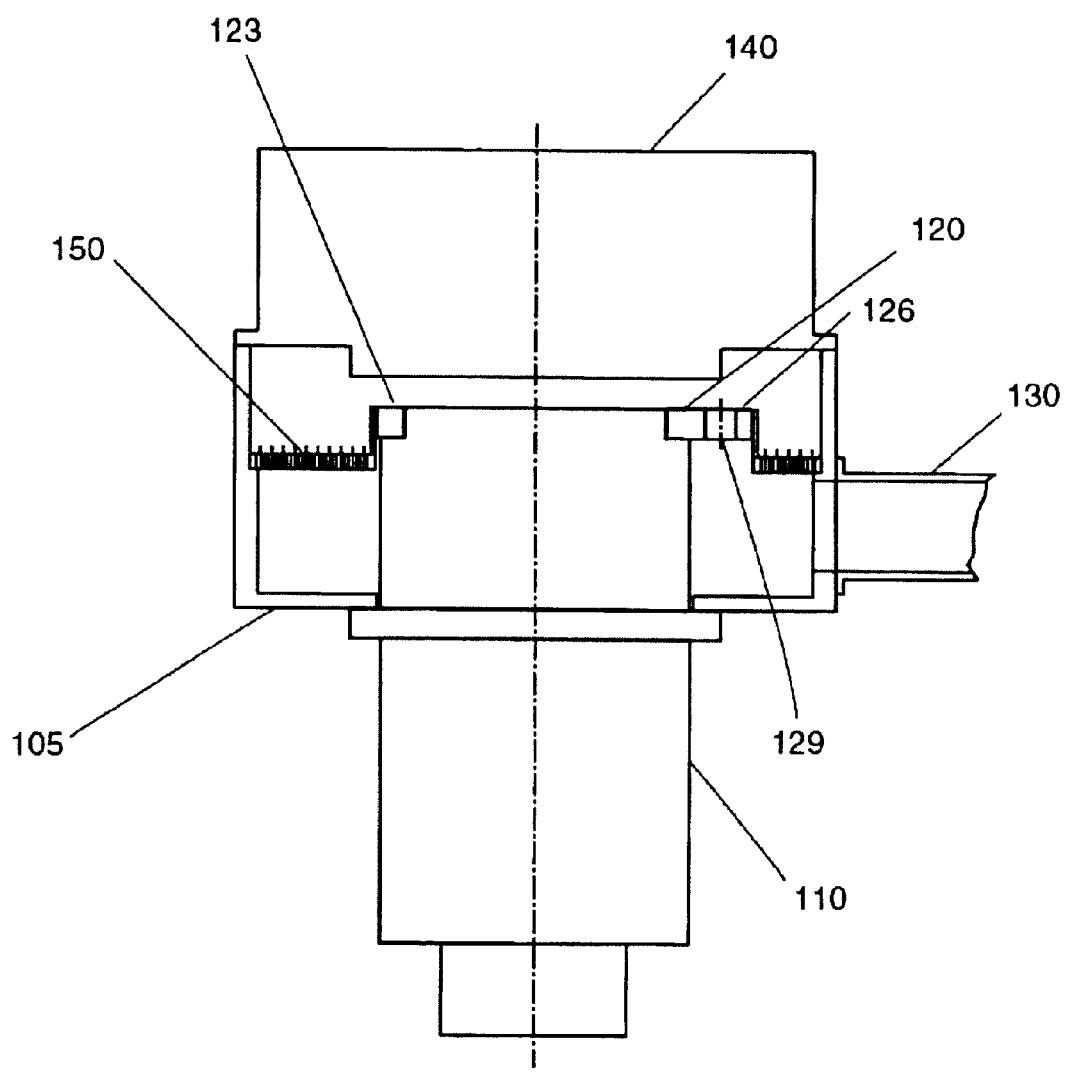
FIG. 7 is a cross-sectional side view of the plasma processing system of FIG. 6.

According to the exemplary embodiment of the present invention shown in FIGS. 6 and 7, an orifice plate or pumping baffle is used in conjunction with focus ring 120 either containing throughholes or not. The focus ring 120 is arranged and located as before. The focus ring 120 is again rotatable, but the pumping baffle 150 rotates with the focus ring 120 as a unit. The pumping baffle 150 has a number of holes 155 to enhance pumping and aid in normalizing pressure gradients across the substrate under process. As with the holes 129 of the focus ring 120, the holes 155 of the pumping baffle 150 can be configured other than as illustrated.

Figure 8:
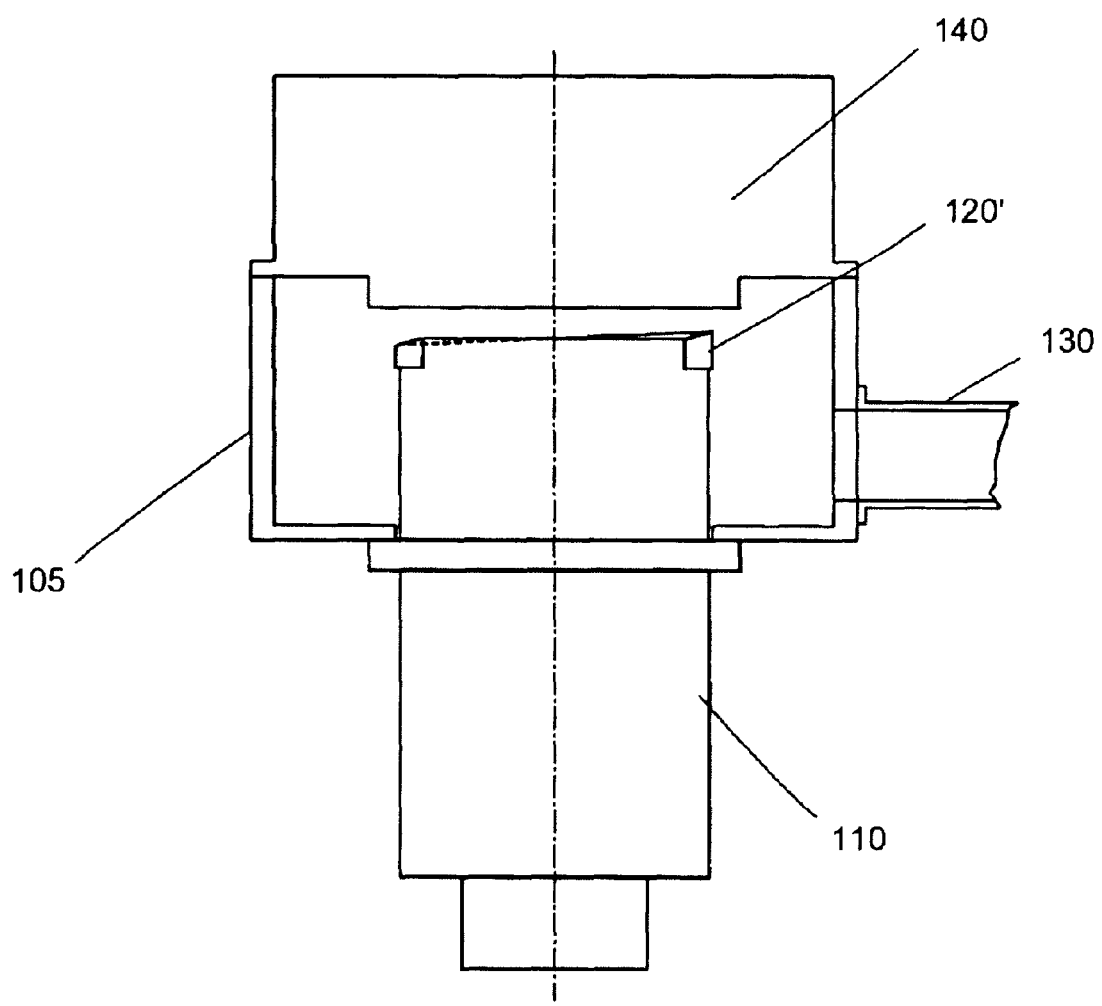
FIG. 8 is a cross-sectional side view of a plasma processing system using a variable cross-section focus ring.

While the embodiments of FIGS. 1–7 have been illustrated as utilizing a focus ring 120 that has a substantially constant thickness, it is also possible to use a non-constant thickness as well. As shown in FIG. 8, the focus ring 120' still is generally configured to fit around the chuck assembly 110 within the process chamber 105. The focus ring 120', however, is constructed with cross-sectional areas varying around the periphery of the element. Generally cross-sections are constructed and placed in such a manner as to restrict the flow in the area of least pressure in the chamber (i.e., near where the major side 126 is placed). By varying the cross-section around the focus ring 120' towards the minor side 123, the variation in cross section (and therefore the variation in restriction) helps to enable uniform pumping in the process chamber 105.

The focus rings 120 of FIGS. 1–8 can be retrofitted into existing process chambers 105 by exchanging the existing focus rings for the illustrated ones. By utilizing such focus rings, process chambers 105 also can be built without the added cost and complexity of a pumping baffle 150. The focus ring 120 can be attached, affixed, or mounted to the chuck assembly using standard design practice for focus rings understood by those skilled in the art of plasma processing.

To improve uniformity, the focus ring 120 may also be equipped with a rotating attachment point. By turning the focus ring 120 using the rotating attachment point, the focus ring 120 is rotated about a centerline of the chuck assembly 110. This enables the system 100 to alter a direction of the pressure gradient. A number of pressure sensing devices, such as pressure manometers, can be coupled to the outer wall of the process chamber 105 and configured to provide information on the spatial variation of the pressure field about the periphery of the processing region. Implementation of a number of pressure sensing devices is understood by one skilled in the art of vacuum system design.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. In a focus ring for use in a plasma chamber having a longitudinal axis extending through the focus ring, the improvement comprising:
   a minor side; and
   a major side, wherein the minor side has a smaller radial width extending in a plane substantially transverse to the longitudinal axis than the major side.

2. The focus ring as claimed in claim 1, wherein the focus ring comprises at least one of quartz, silicon, silicon carbide, carbon, and a ceramic.

3. The focus ring as claimed in claim 1, wherein the focus ring comprises a dielectric material.

4. The focus ring as claimed in claim 1, wherein the focus ring comprises a partially metal structure.

5. The focus ring as claimed in claim 1, wherein the minor side has a radial width of approximately 0.5 to 2.5 cm and the major side has a radial width of approximately 2.5 to 10 cm.

6. The focus ring as claimed in claim 1, wherein the focus ring comprises a structure having plurality of holes in the focus ring.

7. The focus ring as claimed in claim 6, wherein the major side comprises holes in the focus ring larger than holes in the minor side of the focus ring.

8. The focus ring as claimed in claim 1, further comprising mounting points for connecting the focus ring to a chuck assembly.

9. The focus ring as claimed in claim 8, wherein the mounting points comprise a plurality of holes.

10. The focus ring as claimed in claim 1, further comprising a rotating attachment point for rotating the focus ring about a centerline of a chuck assembly.

11. A plasma processing system, comprising:
    a process chamber having a longitudinal axis extending through the focus ring;
    a chuck assembly for holding a substrate in the process chamber; and an asymmetrical focus ring coupled to the chuck assembly, the asymmetrical focus ring having a minor side and a major side, wherein the minor side has a smaller radial width extending in a plane substantially transverse to the longitudinal axis than the major side.

12. The plasma processing system as claimed in claim 11, wherein the focus ring comprises at least one of quartz, silicon, silicon carbide, carbon, and a ceramic.

13. The plasma processing system as claimed in claim 11, wherein the focus ring comprises a structure having a dielectric material.

14. The plasma processing system as claimed in claim 11, wherein the focus ring comprises a structure being partially metallic.

15. The plasma processing system as claimed in claim 11, wherein the minor side has a radial width of approximately 0.5 to 2.5 cm and the major side has a radial width of approximately 2.5 to 10 cm.

16. The plasma processing system as claimed in claim 11, wherein the focus ring further comprises a plurality of holes.

17. The plasma processing system as claimed in claim 16, wherein the major side comprises holes larger than holes in the minor side.

18. The plasma processing system as claimed in claim 11, further comprising a pumping baffle.

19. The plasma processing system as claimed in claim 18, wherein the pumping baffle comprises a plurality of holes.

20. The plasma processing system as claimed in claim 11, wherein the focus ring further comprises a rotating attachment point for rotating the focus ring about a centerline of a chuck assembly.

21. In a focus ring for use in a plasma chamber, the improvement comprising:
    a first side;
    a second side opposite said first side; and
    a plurality of holes in the focus ring, wherein holes of the plurality of holes closer to the first side are larger in diameter than holes of the plurality of holes closer to the second side.

22. The focus ring as claimed in claim 21, wherein sizes of the plurality of holes are monotonically increasing from the second side to the first side.

* * * * *